United States Patent
Lang et al.

(10) Patent No.: US 9,435,845 B2
(45) Date of Patent: Sep. 6, 2016

(54) METHOD AND APPARATUS FOR DETECTING AN ARC IN A DC CIRCUIT

(71) Applicant: SMA Solar Technology AG, Niestetal (DE)

(72) Inventors: Johannes Lang, Gradenau (DE); Thomas Wegener, Kassel (DE); Marcel Kratochvil, Kassel (DE); Holger Behrends, Rhauderfehn (DE); Michael Viotto, Kassel (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 345 days.

(21) Appl. No.: 14/230,423

(22) Filed: Mar. 31, 2014

(65) Prior Publication Data
US 2014/0210485 A1    Jul. 31, 2014

Related U.S. Application Data

(63) Continuation of application No. PCT/EP2012/070311, filed on Oct. 12, 2012.

(30) Foreign Application Priority Data

Oct. 14, 2011    (DE) .................. 10 2011 054 518

(51) Int. Cl.
*G01R 31/02* (2006.01)
*H02H 9/08* (2006.01)
(Continued)

(52) U.S. Cl.
CPC ........... *G01R 31/025* (2013.01); *G01R 31/333* (2013.01); *H01H 9/50* (2013.01); *H01H 33/26* (2013.01); *H02H 1/0015* (2013.01); *H01H 83/20* (2013.01); *H02H 7/205* (2013.01)

(58) Field of Classification Search
CPC .............. G01R 31/025; G01R 31/333; H02H 1/0015; H02H 7/205; H01H 9/50; H01H 33/26; H01H 83/20; H01H 2083/201
USPC .............. 324/500, 522, 536, 537, 538, 713, 324/76.11, 76.39; 702/1, 57, 64; 361/1, 2, 361/12, 14, 42, 134
See application file for complete search history.

(56) References Cited

U.S. PATENT DOCUMENTS 5,729,145 A    3/1998 Blades
6,088,205 A *  7/2000 Neiger ................. H02H 1/0015
                                                    361/42
(Continued)

FOREIGN PATENT DOCUMENTS

EP          1772936 A2    4/2007

OTHER PUBLICATIONS

International Search Report dated Feb. 8, 2013 for PCT/EP2012/070311.

*Primary Examiner* — Hoai-An D Nguyen
(74) *Attorney, Agent, or Firm* — Eschweiler & Associates, LLC

(57) ABSTRACT

The disclosure relates to a method for detecting an arc in a DC circuit. The method includes measuring and analyzing an AC component ($I_{AC}$) of a current (I) flowing in the circuit and determining at least one parameter of the AC component ($I_{AC}$). The level of a DC component ($I_{DC}$) of the current (I) is varied and a degree of correlation between the level of the DC component ($I_{DC}$) of the current (I) flowing in the DC circuit and the at least one parameter of the AC component ($I_{AC}$) is determined. An arc is detected and selectively signaled based on the degree of the determined correlation. The disclosure also relates to an apparatus for carrying out the method and to an inverter comprising such an apparatus.

16 Claims, 3 Drawing Sheets

(51) Int. Cl.
    *H01H 9/50*     (2006.01)
    *H01H 33/26*     (2006.01)
    *G01R 31/333*     (2006.01)
    *H02H 1/00*     (2006.01)
    *H01H 83/20*     (2006.01)
    *H02H 7/20*     (2006.01)

(56) References Cited

U.S. PATENT DOCUMENTS

| | | | | |
|---|---|---|---|---|
| 6,128,169 A * | 10/2000 | Neiger | | G01R 31/12 324/520 |
| 7,633,727 B2 | 12/2009 | Zhou et al. | | |
| 7,864,492 B2 * | 1/2011 | Restrepo | | H02H 1/0015 361/42 |
| 2005/0286184 A1 * | 12/2005 | Campolo | | H02H 1/0015 361/42 |
| 2006/0181816 A1 * | 8/2006 | Pellon | | G01R 31/025 361/5 |
| 2010/0097733 A1 * | 4/2010 | E. | | H02H 1/0015 361/42 |
| 2011/0141644 A1 * | 6/2011 | Hastings | | H01L 31/02021 361/93.2 |
| 2012/0095709 A1 * | 4/2012 | Smith | | G01R 31/025 702/65 |
| 2014/0095086 A1 * | 4/2014 | Parker | | H02H 1/0015 702/58 |

* cited by examiner

METHOD AND APPARATUS FOR DETECTING AN ARC IN A DC CIRCUIT

FIELD

The disclosure relates to a method for detecting an arc in a DC circuit, in which a high-frequency signal in the circuit is measured and analyzed. The disclosure also relates to an apparatus for detecting arcs and to an inverter comprising such an apparatus.

BACKGROUND

In circuits, in particular in DC (direct current) circuits, in which high voltages occur in conjunction with high currents, there is a risk of an arc being formed. Arcs may occur, for example, during maintenance work (disconnection of a line through which current flows), in the event of degradation of contacts on screw connectors or plug-in connectors, at poor solder points or inadequately fastened screw connections or in the event of damaged line insulation. An arc which has been produced can usually only be extinguished by drastically reducing the current flowing via the arc.

In photovoltaic installations (referred to as PV installations in abbreviated form below), arcs are a problem which cannot be underestimated on account of the high DC voltage and the high prevailing direct currents and are one of the main causes of fires in PV installations.

Therefore, reliable methods for detecting arcs which have occurred are of great interest. For reasons of safety, an arc which has occurred should be reliably detected in this case. On the other hand, the likelihood of incorrect detection of alleged arcs should be kept as low as possible, in particular if an automatic switch-off system is associated with the detection of arcs, in which system an automatic restart of the PV installation is prevented, as is required in some countries.

Arcs usually emit a broadband AC (alternating current) signal which extends into the high-frequency range. Methods and apparatuses for detecting arcs which are based on detection of such an AC signal in a circuit are widespread and are described, for example, in the document WO 95/25374 A.

One problem with such methods is that high-frequency interference signals can be incorrectly attributed to an arc, thus resulting in incorrect triggering of the apparatus for detecting arcs. Possible sources of interference signals are, for example, high-frequency radio transmitters, arcs which briefly occur in the current collectors of electric trains or trams which travel past in the immediate vicinity of the system being monitored, or electrical or electronic devices having insufficient electromagnetic shielding or interference signal suppression. Arcs in adjacent circuits may also couple into a system under consideration and may incorrectly trigger the apparatus for detecting arcs. A plurality of parallel DC circuits are often provided in PV installations, a PV partial generator and an inverter being arranged in each DC circuit. All high-frequency signals or signal components in a circuit which do not originate from an arc which has occurred in this circuit are referred to below, in summary, as "interference signals" and their sources are referred to as "interference sources" or "interferer".

In order to increase the reliability with which arcs are detected, the document U.S. Pat. No. 7,633,727 B2 discloses an arc detection system which has two narrowband bandpass filters operating at different frequencies. An arc is determined as having occurred only when a high-frequency signal having signal components in the two different frequency ranges determined by the bandpass filters is observed. If, however, an interference signal has a frequency spectrum of a similar width to the typical frequency spectrum of an arc, this interference signal cannot be distinguished from a high-frequency signal originating from an arc.

The document EP 1 772 936 A2 discloses an apparatus and a method for detecting arcs in an AC circuit, in which a rate of change of the current in the circuit is detected in addition to the high-frequency signal components. If this rate of change indicates processes in the circuit which might fundamentally be triggers of an arc, for example a sudden current rise or fall, and a high-frequency signal indicating an arc is observed at the same time, it is assumed that an arc is actually present. However, in particular in circuits in which very high overall currents occur, for example in the DC circuits of PV installations, processes which trigger arcs cannot necessarily be clearly detected using a rate of change of the overall current.

SUMMARY the present disclosure provideS a method for detecting arcs which allows reliable distinction of interference signals from those high-frequency signals which are based on an arc which has actually occurred in the circuit. An apparatus for detecting arcs in circuits which is correspondingly insensitive to interference signals is also discussed.

A method according to the disclosure for detecting an arc in a DC circuit comprises measuring and analyzing
an AC component of a current flowing in the DC circuit, determining at least one parameter of the AC component, and varying the level of the DC component of the current flowing in the DC circuit. Furthermore, the method comprises determining a degree of correlation between the level of the current flowing in the DC circuit and the at least one parameter of the AC current component. An arc is then selectively detected and signaled dependent on the degree of the determined correlation.

In arcs, there is a relationship between properties of a higher-frequency AC signal emitted by the arc in the circuit and the level of the current flowing through this arc. This relationship is used, according to the disclosure, to determine whether a measured AC component containing the higher-frequency signal actually originates from an arc which has occurred in the circuit. For this purpose, the level of the direct current flowing in the circuit is varied and the extent to which parameters of the measured higher-frequency signal are correlated with the level of the direct current flowing in the circuit is determined. On the basis of the degree of correlation determined in this manner, an arc is considered to have been detected and is signaled. The method enables reliable distinction of an arc signal from an interference signal since the properties of interference signals, and in particular of interference signals externally injected into a circuit, are generally not influenced by the level of the direct current flowing in the circuit under consideration. Within the scope of the application, a signal at a frequency in the range of approximately 10 kHz (kilohertz) to approximately 1 MHz (megahertz) can be considered to be a relevant higher-frequency AC signal.

In one embodiment of the method, a signal strength of the measured AC component is considered as the parameter. The degree of determined correlation increases if the signal strength falls with increasing level of the current. A degree of correlation determined in this manner reflects the occurrence of an arc particularly well.

In another embodiment of the method, the level of the current is varied by means of periodic modulation. Correlation can be reliably detected by the current change passed through several times during modulation. If an inverter is arranged in the circuit under consideration, the variation or modulation of the current is caused by the inverter in this case. The variation or modulation is caused by switching operations of semiconductor power switches of the inverter during voltage conversion or by the inverter carrying out a maximum power point (MPP) tracking method. In this manner, current variation which is carried out during operation of the inverter anyway can be used when carrying out the method according to the disclosure.

In another embodiment of the method, the modulation is dependent on identification parameters of an apparatus carrying out the method. If a plurality of adjacent circuits are present in a larger system, an arc which has occurred in a first circuit may result in crosstalk in a second circuit, with the result that an AC signal is also present in the second circuit. Under certain circumstances, the problem of the respective current being synchronously modulated when an AC signal is simultaneously detected in both circuits then exists, which would result in a supposed arc being identified in both circuits. In one embodiment, the apparatuses carry out modulation processes in the respective circuits, which processes are dependent on identification parameters of the apparatus and are thus different for the two apparatuses and differ in terms of a modulation frequency and/or a modulation sequence, for example. On account of the different modulation processes, correlation then only occurs in the circuit in which the arc is actually burning.

In another embodiment of the method, the level of the current is varied if the parameter of the AC component exceeds a threshold value. In this manner, the AC component of the current is first of all monitored in order to determine whether there is an indication of an arc in the circuit. Only then are the further method acts carried out. In one embodiment the threshold value is determined in this case with the aid of low-pass filtering from the parameter of the AC component. Arcs are usually formed suddenly, rather than slowly. The threshold value is adaptively determined by the low-pass filtering. On the one hand, it may follow slowly changing interference signals, with the result that the latter are not incorrectly detected, but, on the other hand, is exceeded by an arc which suddenly occurs.

In another embodiment of the method, the following further acts occur after an arc has been detected: The level of the DC component of the current is reduced to zero or almost zero and a further measurement of the AC component of the current is performed. It is then determined whether an AC signal is still present in the further measurement. If it is, the presence of a parallel arc is signaled. If an AC signal is not present any more or is reduced to a very low level, it is signaled that a series arc has occurred. This way, the method can be also used to distinguish between the two possible types of an arc, a series arc which occurs electrically in series with the PV generator on the one hand and a parallel arc which occurs parallel to the PV generator or parallel to a part of the PV generator.

An apparatus according to the disclosure for detecting an arc in a DC circuit comprises means for varying the level of a DC component of the current flowing in the circuit and an evaluation unit configured to analyze a measured AC component of the current and determine at least one parameter of the AC component. A correlation unit configured to determine a degree of correlation between the level of the current component flowing in the circuit and the at least one parameter of the AC component, and a signaling output, at which the presence of an arc is signaled based on the degree of the determined correlation, are also provided. The advantages associated with the apparatus correspond to those of the method.

BRIEF DESCRIPTION OF THE DRAWINGS

The disclosure is explained in more detail below using example embodiments with the aid of four figures, in which.

DETAILED DESCRIPTION

Figure 1:
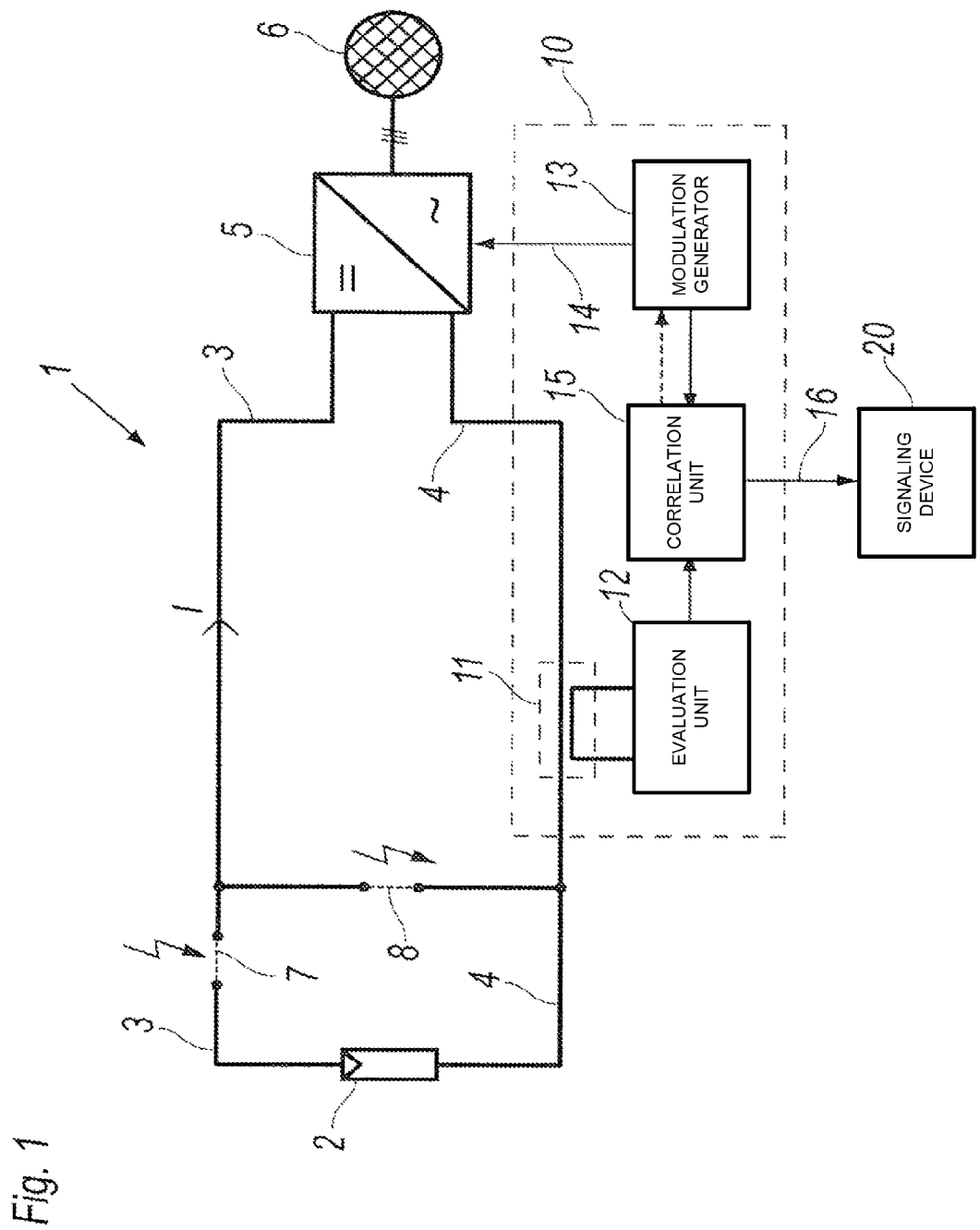
FIG. 1 shows a schematic illustration of a PV installation with an apparatus for detecting arcs.

FIG. 1 schematically shows the basic structure of a PV installation 1 with an apparatus 10 for detecting an arc.
The PV installation 1 has a photovoltaic (PV) generator 2, from which direct current lines 3, 4 lead to a DC input stage of an inverter 5 which is connected to an energy supply grid 6.

By way of example, the PV generator 2 is symbolized in FIG. 1 by the circuit symbol for an individual photovoltaic cell. In one implementation of the PV installation illustrated, the PV generator 2 may be an individual photovoltaic (PV) module which in turn contains a multiplicity of photovoltaic cells. The PV generator 2 may likewise also be a series circuit comprising a plurality of PV modules, a so-called string. A parallel circuit or a mixed series and parallel circuit comprising PV modules are also possible.

The energy supply grid 6 may be a public supply system or a private system (isolated or island operation). For example, the inverter 5 is designed with three AC outputs for three-phase feeding into the energy supply grid 6. It goes without saying that a design of the inverter 5 and/or of the energy supply grid 6 other than the three-phase design illustrated is also possible, for example a single-phase design. In addition, only those parts of the PV installation 1 which are essential within the scope of the application are illustrated in FIG. 1. Further elements arranged on the DC or AC side of the inverter 5, for example disconnecting or switching elements, filters, monitoring devices or transformers, are not illustrated for reasons of clarity.

By way of example, two possible arcs that may occur in the circuit formed by the PV generator 2, the direct current lines 3, 4 and the DC input stage of the inverter 5 in the PV installation are illustrated in FIG. 1. A first arc is a series arc 7 which occurs electrically in series with the PV generator 2 at an interruption inside one of the direct current lines 3, 4, here the direct current line 3, for example. A second arc is a parallel arc 8 which occurs parallel to the PV generator 2. In principle, parallel arcs may occur between two points of the circuit at which a different potential prevails. A parallel arc may thus also occur parallel to a part of the PV generator 2, that is to say parallel to an individual PV module, for example.

The apparatus 10 for detecting arcs comprises a current sensor 11 for determining a current I flowing in the circuit and, in particular, for determining high-frequency components of the current flowing in the circuit. A DC component of the current I is denoted $I_{DC}$ and a higher-frequency AC component is denoted $I_{AC}$ below. In the present case, the current sensor 11 is in the form of a coupling coil (pick-up coil) which interacts with one of the direct current lines 3, 4, here the direct current line 4, for example. In one implementation of the current sensor 11, it is possible to use, for example, a Rogowski coil or a DC-isolating transformer, the coils of which are looped into the circuit. It is likewise possible to use Hall sensors or low-impedance shunts in one of the direct current lines 3, 4. The signal tapped off by the current sensor 11 is supplied to an evaluation unit 12 which may comprise signal-amplifying and signal-filtering elements. The evaluation unit 12 provides, at an output, a signal which represents a property (parameter) of the AC component $I_{AC}$. Such a property may be, for example, a signal strength which is, in one embodiment, detected in one or more predefined frequency ranges of the high-frequency signal in which arcs characteristically have spectral energy, for example, within the range of approximately 10 kHz to approximately 1 MHz which has already been mentioned above.

The apparatus 10 also comprises a modulation generator 13 which is connected to the inverter 5 via a current preset line 14. The modulation generator 13 may influence the current I flowing in the DC circuit via the inverter 5 using the current preset line 14. This current is usually varied by the inverter 5 within a so-called MPP (Maximum Power Point) tracking method, also called MPP tracking, in such a manner that the PV generator 2 is operated at an operating point of maximum power. The modulation generator 13 may vary the current I, in a manner differing from the fundamentally set current flow, at the optimum operating point via the current preset line 14. In this case, a decrease and/or increase in the current is/are conceivable as a variation. The modulation generator 13 may generate a periodic or aperiodic current variation in any desired pattern, for example a sinusoidal or square-wave variation, a variation according to a pulse or binary code method or else a variation in the form of a wavelet.

The evaluation unit 12 and the modulation generator 13 are connected to a correlation unit 15. The evaluation unit 12 passes the considered parameter of the AC component $I_{AC}$ of the current I, for example the signal strength of a measured high-frequency signal in the circuit, to the correlation unit 15, and the modulation generator 13 passes a signal representing the current variation of the DC component $I_{DC}$ of the current I. The correlation unit 15 determines a degree of correlation between the two supplied signals. The degree of correlation reflects the extent to which changes in the signals are temporally connected to one another. A mathematical correlation function which uses a link between Fourier transforms, in particular fast Fourier transforms (FFT) in one implementation, is suitable for determining a degree of correlation, for example. In particular, if the current I is varied in the form of a wavelet, the degree of correlation may alternatively be determined from the current variation and the temporal profile of the parameter by means of a cross-correlation.

One possible way of representing a degree of correlation is to map the correlation to a range of values from −1 to +1, a value of +1 representing maximum positive correlation and a value of −1 representing maximum negative correlation and a value of 0 representing no correlation. Correlation in which an increase in one signal is associated with an increase in the other signal can be understood as positive correlation. Negative correlation is that in which an increase in one signal is linked to a decrease in the other signal. A high degree of correlation is present in the case of a large absolute value of the degree of correlation defined in this manner.

In dependence of the degree of correlation, the correlation unit 15 outputs, at a signaling output 16, a signal indicating an arc. In the embodiment illustrated in FIG. 1, the signal is supplied to a signaling device 20 which can be used, for example, to initiate manual switch-off of the PV system in order to extinguish an arc. Alternatively, provision may be made for the signal output at the signaling output 16 to be supplied to the inverter 5 or to a disconnecting element arranged in the circuit in order to automatically interrupt the current in order to extinguish an arc.

As illustrated, the apparatus 10 may be in the form of a separate unit. However, in one embodiment it is also possible to integrate the apparatus 10 in the inverter 5.

A method for detecting an arc in a circuit, as can be carried out by the PV installation shown in FIG. 1 for example, is illustrated below using FIGS. 2 to 4. Reference symbols used below relate to the embodiment illustrated in FIG. 1, for example.

Figure 2:
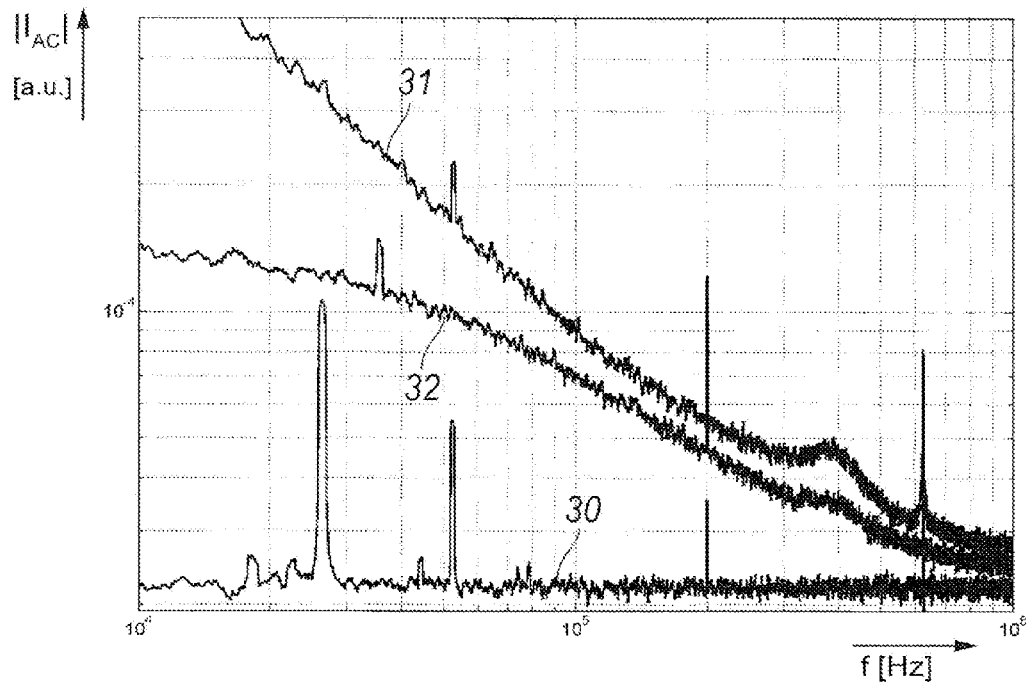
FIG. 2 shows a graph containing signal spectra of arcs at different current flows.

FIG. 2 shows, in a graph, measured signal spectra of an arc through which direct currents of different current intensity flow. A signal strength $|I_{AC}|$ of an AC current $I_{AC}$ in a circuit in arbitrary units (a.u.) is illustrated on the Y axis of the graph against the frequency plotted on the X axis of the graph. Both axes have a logarithmic scale.

Three signal spectra 30, 31, 32 (frequency spectra) of a measured current signal are represented in the graph. The signal spectrum 31 represents the spectrum of an arc in the case of a small direct current flowing through the arc, whereas the signal spectrum 32 is that of an arc through which a current greater approximately by a factor of 5 flows. For the purpose of comparison, the signal spectrum 30 is used to represent the spectrum of the same circuit without a burning arc. It can be seen that the signal spectrum 31 of the arc with a smaller current flow has greater signal strength virtually over the entire frequency range illustrated than the signal spectrum 32 of the arc with a larger direct current flow. However, in the two signal spectra 31, 32, the signal strength is above that of the reference signal spectrum 30 in the entire frequency range illustrated, individual peaks in the signal spectra 30-32 which are either based on brief interference or constitute harmonics of switching processes in the inverter being disregarded.

The measured results clearly show that the signal strength and the current flowing through an arc have a negative correlation with one another.

Figure 3:
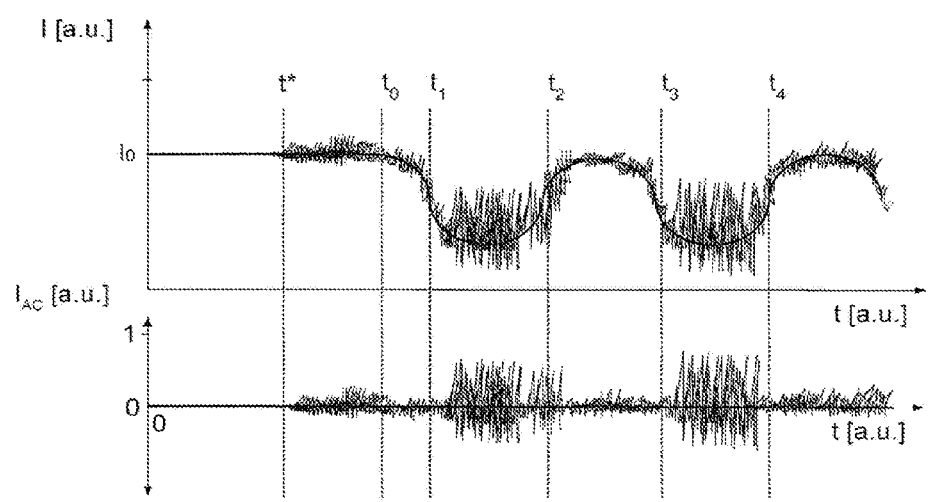
FIG. 3 shows a schematic graph of signals measured in a circuit on the basis of time.

FIG. 3 illustrates how the negative correlation, demonstrated using FIG. 2, can be used to detect an arc. FIG. 3 shows, in an upper part, a time dependence of a current I measured in a circuit, for example, in the DC circuit of the PV installation 1 in FIG. 1. The AC component $I_{AC}$ of the measured current I is represented on the same scale in the lower part of the figure.

A constant direct current I of the magnitude $I_0$ without significant AC components is first of all observed at times t<t*. At a time t=t*, considerable AC components $I_{AC}$ in the form of a noise signal occur in the measured current signal. A possible cause of these AC components could lie in the formation of an arc. Beginning with a time $t_0$, a periodic low-frequency variation, also referred to as modulation below, of the level of the DC component $I_{DC}$ of the current I, which has an approximately sinusoidal profile, is now carried out, the turning points of the curve approximately being indicated with the times $t_1$, $t_2$, $t_3$, $t_4$ in the graph.

Over the course of low-frequency modulation, the DC component $I_{DC}$ of the measured current decreases between the times $t_1$ and $t_2$ and the times $t_3$ and $t_4$ and reaches the original value of $I_0$ again in the intervening period of time between $t_2$ and $t_3$. In the case of the higher-frequency AC component $I_{AC}$ extracted in the lower part of the figure in particular, it can be seen that it increases considerably in the periods of time between $t_1$ and $t_2$ and between $t_3$ and $t_4$ in which the DC component of the current has decreased, whereas it decreases to the original signal strength value present at the time $t_0$ again for the period of time between $t_2$ and $t_3$ and for times $t>t_4$. A high degree of negative correlation between the DC component $I_{DC}$ flowing in the circuit and the higher-frequency AC component $I_{AC}$ to be observed in the circuit has thus been demonstrated. It is highly likely that the observed higher-frequency AC signal is thus based on an arc which has occurred in this circuit.

Figure 4:
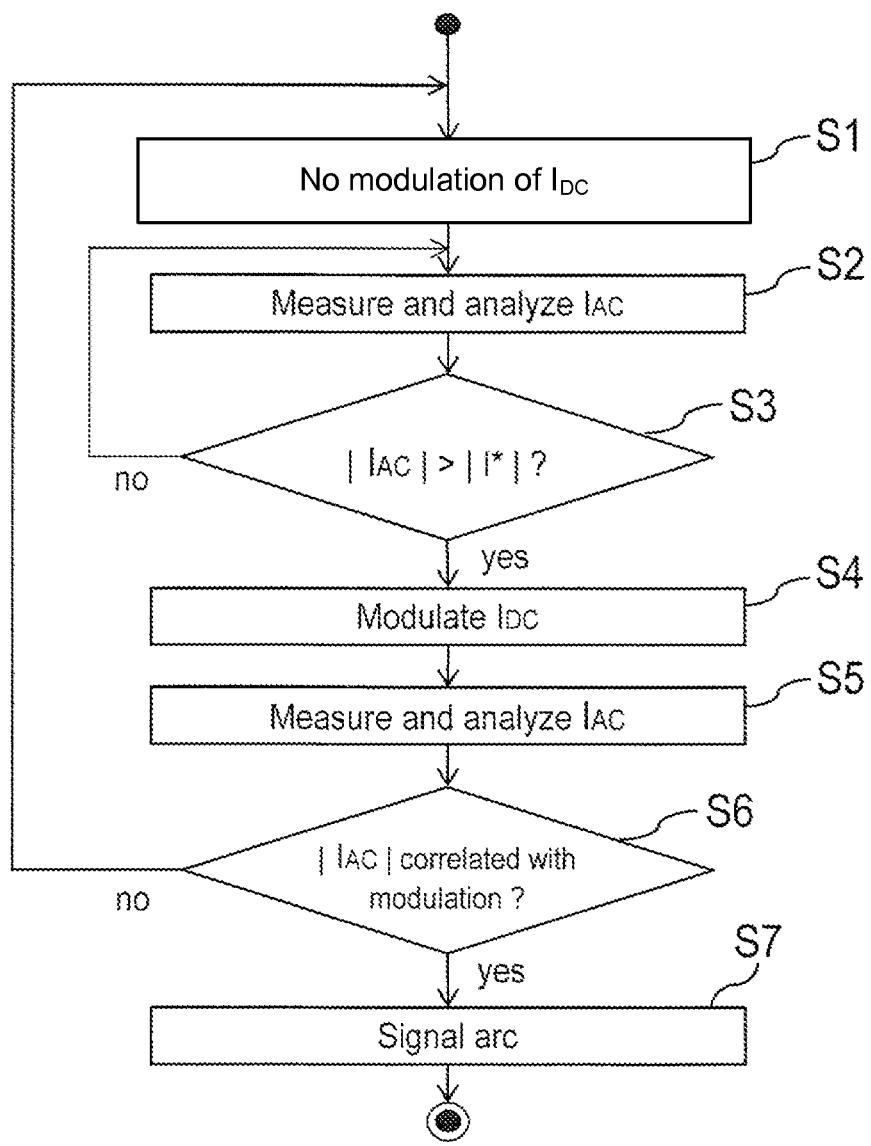
FIG. 4 shows a flowchart of an example embodiment of a method for detecting an arc in a circuit.

FIG. 4 illustrates a flowchart of an example embodiment of a method for detecting an arc in a circuit.

At S1, the circuit is operated in such a manner that a DC component $I_{DC}$ in the circuit is not modulated. This may be effected, for example, by deactivating the modulation generator 13 in the example embodiment in FIG. 1.

At S2, an AC component $I_{AC}$ of the current I flowing in the circuit is measured and analyzed by determining its signal strength $|I_{AC}|$, for example in a predefined frequency band, as a property of the AC component $I_{AC}$.

At S3, the determined signal strength is compared with a predefined threshold value $|I^*|$, $I^*$ being a current threshold value corresponding to the threshold value of the signal strength. In this case, the threshold value $|I^*|$ may be permanently predefined or else may be adapted to conditions currently present in the circuit in an adaptive method. One example of an adaptive method is explained in more detail further below. If the signal strength is below the predefined threshold value, the method branches back to S2. However, if a signal whose signal strength is above the threshold value $|I^*|$ is observed at S3, this is considered to be an indication of the occurrence of an arc and the method branches to S4. In the example in FIG. 3, this is given at a time $t=t^*$.

At S4, modulation of the level of the current I in the circuit is started, as can be seen as of the time $t_0$ in FIG. 3, for example. In the example embodiment in FIG. 1, correspondingly, approximately sinusoidal modulation could be generated by the modulation generator 13 and could be implemented in the circuit via the current preset line 14 and the inverter 5.

At S5, the AC component $I_{AC}$ of the current flow in the circuit is measured and analyzed again. In this case, a measurement is carried out as a measurement sequence of measured values which in one embodiment extends over a period of time of a plurality of modulation periods.

At S6, it is determined whether the signal strength of the $I_{AC}$ signal is correlated with the modulation of the DC component of the current $I_{DC}$. If this is the case, an arc is signaled at S7, for example, by outputting a corresponding signal at the signaling output 16 in FIG. 1.

In alternative embodiments, provision may be made for an arc to be not only signaled but also quenched at S7 by briefly or permanently reducing the current flow in the circuit or by even entirely interrupting the current (reducing it to zero). In case the detected arc is a series arc, as e.g. the series arc 7 shown in FIG. 1, the arc can thereby be extinguished. In a further embodiment, the AC component of the current is measured again after the DC current in the circuit has been reduced to zero or almost to zero. It is then determined whether an AC signal is still present according to the further measurement. If it is, the arc has not be extinguished and the observed signal can be assigned to a parallel arc. Thus, the presence of a parallel arc is signaled.

If, contrary, an AC signal is not present any more or is reduced to a very low level which is likely to be attributed to an interferer or to a noise signal, it is signaled that the arc which has been determined in the first place was a series arc.

If no correlation between the signal strength of the $I_{AC}$ signal and the modulation of the current is determined at S6, this can be considered to be an indication that the signal observed at acts S2 and S3 does not originate from an arc which has occurred in the circuit, but rather is an interference signal caused by an external or internal interference source. In this case, the method branches back to S1 in which a constant DC component $I_{DC}$ is set in the circuit, for example by deactivating the modulation generator 13 in FIG. 1.

The information that the observed signal is attributed to an interference source in that case can also be used to adapt the method to this situation in a self-adaptive manner. For this purpose, the threshold value $|I^*|$ on which the decision at S3 is based can be changed, for example, in such a manner that the measured signal is not deemed to be an indication of the presence of an arc. It is also conceivable for the signal analysis carried out at S2 to be adapted, for example by selecting a frequency range in which the observed signal has spectral components that are as small as possible.

The information that the observed signal is attributed to an interference source in that case can also be used to inform other devices of the presence of an interference signal via the signaling output 16. Other devices in this regard are e.g. adjacent inverters or communication devices for forwarding signals to installation monitoring means or to the installation operator.

Another adaptive method uses the fact that arcs usually do not develop slowly but rather occur suddenly. In this method, the threshold value $|I^*|$ is continuously determined from the sliding average of the measurements of the signal strength $|I_{AC}|$ which are recurrently carried out at S2. Low-pass filtering of the measured signal strength is equivalent to forming the sliding average. For example, the threshold value $|I^*|$ may be set as a multiple of, for example triple, the sliding average. A resulting arc is associated with a sudden rise in the signal strength $|I_{AC}|$ which then at least temporarily considerably exceeds the sliding average and is above the threshold value $|I^*|$. In this case, the sliding average is formed with a time constant which is large enough to not follow the sudden rise in the signal strength $|I_{AC}|$ and is small enough to adapt the threshold value to slow changes in the signal strength which are based, for example, on a change in the impedance in the circuit on account of changed ambient conditions.

In an alternative embodiment of the method, provision may be made for the DC component of the current I to be permanently modulated. In this case, as described above, this modulation may be specifically applied, for example, with the aid of the modulation generator 13. However, it is also possible to resort to a periodic current variation, which is inherently present in the circuit, as modulation. The cause of such a suitable recurring current variation may lie, for example, in switching cycles of power semiconductor switches of DC-DC converters or AC bridges of the inverter 5. In this case, the switching cycles are based on modulation methods which are carried out inside the DC-DC converter or the inverter for the purpose of converting a direct current into an alternating current. Examples of modulation methods which are used in this process are the sine-delta modulation method or the space vector modulation method. A periodic current variation which is correlated with a system frequency prevailing in the energy supply grid 6 can also be considered to be modulation in this sense. Compared with the frequency range in which arcs usually emit their characteristic high-frequency signal, the processes mentioned which lead to a current variation occur in a low-frequency frequency range.

The method mentioned can also be used in a particularly advantageous manner if a plurality of DC circuits are each assigned to different inverters inside a PV system. However, the problem of adjacent inverters simultaneously starting modulation of the respective current in the DC circuit assigned to them and then synchronously carrying out the modulation after a higher-frequency signal has been detected exists under certain circumstances, which could result in a supposed arc being identified in both circuits. In order to avoid this problem, provision may be made for a temporal modulation profile to be individually configured for each DC circuit. This may be effected, for example, by means of communication between the apparatuses 10 or with a superordinate control unit, for example an installation monitoring means, during which the starting time or a modulation frequency or sequence is individually agreed or predefined by the superordinate control unit. It is also conceivable to use unique identification parameters of the apparatuses 10 or of the inverters 5 used in the circuit, for example a serial number, to generate individual modulation patterns.

In the embodiments described above, the degree of correlation was determined in each case by comparing the level of the higher-frequency signal and the level of the direct current flowing in the circuit. Alternatively or additionally, the power observed in a particular spectral range or a maximum value observed in a particular spectral range or a half-value width of a structure similar to resonance in the signal spectrum of the signal can also be used as the considered property or parameter of the AC voltage component of the current and thus as a basis for determining correlation. For the rest, each of these parameters can either be considered in absolute terms or can be related to further parameters in the circuit, for example the level of the measured current or the magnitude of the power transmitted by the circuit.

The invention claimed is:

1. A method for detecting an arc in a DC circuit, comprising:
   measuring and analyzing an AC component of a current flowing in the DC circuit and determining at least one parameter of the AC component;
   varying a level of a DC component of the current;
   determining a degree of correlation between the level of the DC component of the current flowing in the DC circuit and the at least one parameter of the AC component, and
   selectively detecting and signaling an arc based on the determined degree of correlation.

2. The method as claimed in claim 1, wherein a signal strength of the measured AC component comprises the parameter.

3. The method as claimed in claim 1, wherein detecting and signaling an arc occurs when the degree of the determined correlation is greater than a predefined degree of correlation.

4. The method as claimed in claim 2, wherein the degree of the determined correlation increases if the signal strength falls with an increasing level of the DC component of the current.

5. The method as claimed in claim 1, wherein varying comprising varying the level of the DC component of the current by means of periodic modulation.

6. The method as claimed in claim 5, wherein the modulation is effected in sinusoidal or square-wave form or in the form of a wavelet.

7. The method as claimed in claim 5, wherein the modulation is dependent on identification parameters of an apparatus carrying out the method.

8. The method as claimed in claim 1, wherein an inverter is arranged in the circuit and wherein the variation or modulation of the level of the DC component of the current is caused by the inverter.

9. The method as claimed in claim 8, wherein the variation or modulation is caused by switching operations of semiconductor power switches of the inverter during voltage conversion.

10. The method as claimed in claim 9, wherein the variation or modulation is caused by the inverter carrying out a maximum power point (MPP) tracking method.

11. The method as claimed in claim 1, wherein the level of the DC component of the current is varied if the parameter of the AC component exceeds a threshold value.

12. The method as claimed in claim 11, wherein the threshold value is determined with the aid of low-pass filtering of the parameter of the AC component.

13. The method as claimed in claim 1, further comprising the following after an arc has been detected:
   reducing the level of the DC component of the current to zero or almost zero;
   performing a further measurement of the AC component of the current;
   determining whether an AC signal is still present in the further measurement, and
   signaling the presence of a parallel arc if an AC signal is present, or signaling that a series arc has occurred if an AC signal is not present.

14. An apparatus configured to detect an arc in a circuit, comprising:
   a modulation unit configured to vary a current flowing in the circuit;
   an evaluation unit configured to analyze a measured AC component of the current and determine at least one parameter of the AC component;
   a correlation unit configured to determine a degree of correlation between the level of a DC component of the current flowing in the circuit and the at least one parameter of the AC component, and
   a signaling output at which a presence of an arc is selectively signaled based on the degree of the determined correlation.

15. An inverter comprising an apparatus as claimed in claim 14.

16. The inverter as claimed in claim 15, wherein the inverter is configured to operation within a photovoltaic installation.

* * * * *